(12) United States Patent
Ohmi et al.

(10) Patent No.: US 7,879,182 B2
(45) Date of Patent: Feb. 1, 2011

(54) SHOWER PLATE, PLASMA PROCESSING APPARATUS, AND PRODUCT MANUFACTURING METHOD

(75) Inventors: Tadahiro Ohmi, Miyagi (JP); Masaki Hirayama, Miyagi (JP); Tetsuya Goto, Miyagi (JP)

(73) Assignee: Foundation for Advancement of International Science, Ibaraki (JP)

( * ) Notice: Subject to any disclaimer, the term of this patent is extended or adjusted under 35 U.S.C. 154(b) by 0 days.

(21) Appl. No.: 10/584,340

(22) PCT Filed: Sep. 24, 2004

(86) PCT No.: PCT/JP2004/014421

§ 371 (c)(1),
(2), (4) Date: Aug. 1, 2006

(87) PCT Pub. No.: WO2005/067022

PCT Pub. Date: Jul. 21, 2005

(65) Prior Publication Data

US 2007/0144671 A1  Jun. 28, 2007

(30) Foreign Application Priority Data

Dec. 26, 2003 (JP) ............................. 2003-434769

(51) Int. Cl.
*C23F 1/00* (2006.01)
*H01L 21/306* (2006.01)
*C23C 16/00* (2006.01)

(52) U.S. Cl. ........................... 156/345.33; 156/345.34; 118/715

(58) Field of Classification Search ............ 156/345.33, 156/345.34; 118/715
See application file for complete search history.

(56) References Cited

U.S. PATENT DOCUMENTS

| | | | |
|---|---|---|---|
| 5,423,936 A | 6/1995 | Tomita et al. | |
| 5,593,540 A | 1/1997 | Tomita et al. | |
| 5,819,434 A * | 10/1998 | Herchen et al. | 34/232 |
| 6,159,297 A | 12/2000 | Herchen et al. | |
| 6,565,661 B1 * | 5/2003 | Nguyen | 118/715 |
| 6,599,367 B1 | 7/2003 | Nakatsuka | |
| 6,830,652 B1 | 12/2004 | Ohmi et al. | |
| 2002/0000196 A1 * | 1/2002 | Park | 118/715 |
| 2004/0050494 A1 | 3/2004 | Ohmi et al. | |
| 2004/0094094 A1 | 5/2004 | Ohmi et al. | |
| 2004/0221809 A1 | 11/2004 | Ohmi et al. | |

FOREIGN PATENT DOCUMENTS

| | | |
|---|---|---|
| EP | 1 300 878 A1 | 4/2003 |
| JP | 62-60875 A | 3/1987 |
| JP | 7-007001 | 1/1995 |
| JP | 10-50678 | 2/1998 |
| JP | 11-256328 | 9/1999 |
| JP | 11-256370 | 9/1999 |

(Continued)

*Primary Examiner*—Michael Cleveland
*Assistant Examiner*—Keath T Chen
(74) *Attorney, Agent, or Firm*—Foley & Lardner LLP

(57) ABSTRACT

A system for processing a substrate uniformly by increasing the number of gas discharge holes being arranged per unit area of a shower plate as receding from the center of the shower plate or increasing the radii of the gas discharge holes as receding from the center of the shower plate thereby making the plasma excitation gas flow uniform.

3 Claims, 15 Drawing Sheets

FOREIGN PATENT DOCUMENTS

| | | |
|---|---|---|
| JP | 11-297672 A | 10/1999 |
| JP | 2000-306886 A | 11/2000 |
| JP | 2001-102357 A | 4/2001 |
| JP | 2001-189308 A | 7/2001 |
| JP | 2002-512445 A | 4/2002 |
| JP | 2002-299240 A | 10/2002 |
| JP | 2002-299330 | 10/2002 |
| JP | 2002-355550 A | 12/2002 |
| JP | 2003-68716 A | 3/2003 |
| JP | 2003-163204 A | 6/2003 |
| WO | WO 00/74127 A1 | 12/2000 |

\* cited by examiner

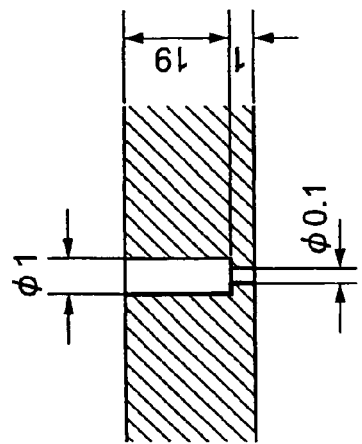
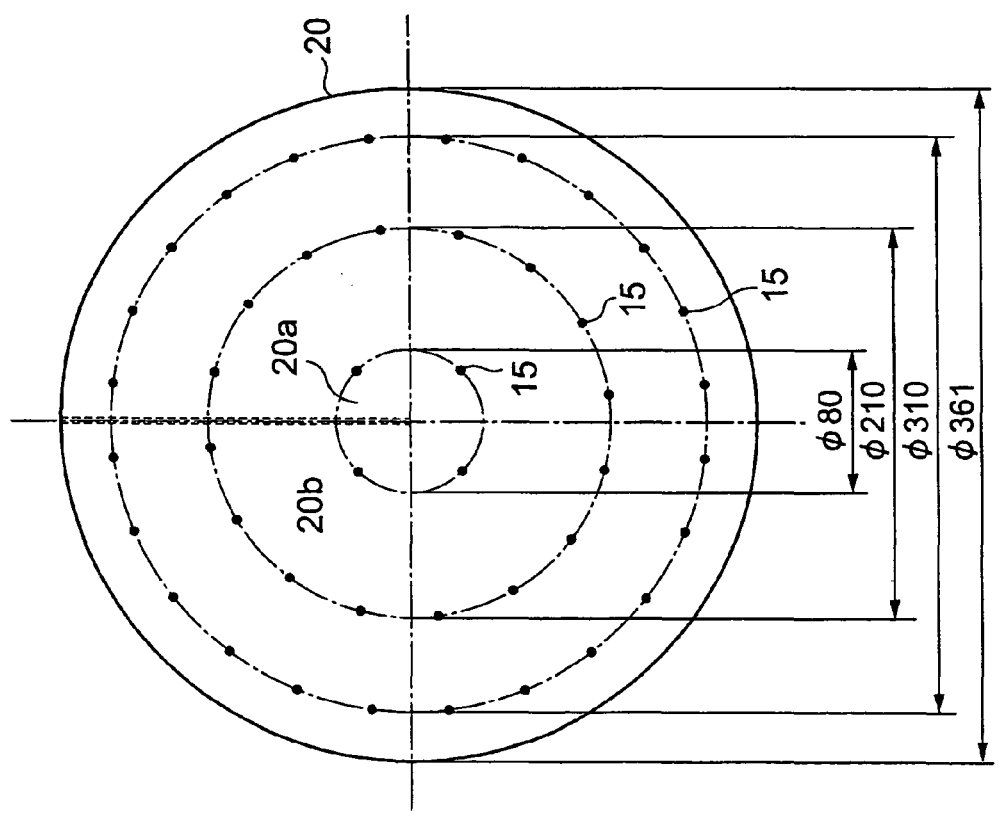

US 7,879,182 B2

SHOWER PLATE, PLASMA PROCESSING APPARATUS, AND PRODUCT MANUFACTURING METHOD

TECHNICAL FIELD

This invention relates to a plasma processing apparatus adapted to carry out processes, such as CVD, etching such as RIE, ashing, oxidation, nitridation, and oxynitridation, on a processing object such as a semiconductor substrate or a liquid crystal display substrate, and a manufacturing method for manufacturing a product such as a semiconductor device by the use of such liquid crystal display device or an organic EL display device. Plasma processing apparatus, and in particular, relates to a shower plate for use in the plasma processing apparatus or the manufacturing method.

BACKGROUND ART

Conventionally, as a semiconductor manufacturing apparatus of this type, use has been made of a plasma processing apparatus as described in Japanese Unexamined Patent Application Publication (JP-A) No. 2002-299330 (hereinafter referred to as Document 1). As described in Document 1, this plasma processing apparatus comprises a radial line slot antenna (hereinafter referred to as an antenna) adapted to radiate a microwave into a process chamber, a phase delay plate adapted to compress the wavelength of the microwave radiated from the antenna, and a cover plate disposed at an interval from the phase delay plate. The plasma processing apparatus further comprises a shower plate made of a low-loss dielectric, having a number of gas ejection holes, and disposed immediately below the cover plate. Further, a conductor construction having a number of nozzles is disposed under the shower plate at an interval therefrom.

A gas for plasma generation is supplied to the inside of the shower plate. When the microwave is applied from the antenna in this state, a high-density plasma is generated in a space between the shower plate and the conductor construction. This plasma is introduced through the conductor construction into a process space where a semiconductor wafer is processed. With such a configuration, a process gas ejected from the nozzles of the conductor construction is excited by the high-density plasma formed under the shower plate.

In this case, the shower plate is formed with a plasma gas supply passage communicating with a plasma gas supply port provided in an outer wall of the process chamber. From the plasma gas supply port, the plasma excitation gas such as Ar or Kr is fed to the supply passage in the shower plate. Further, the excitation gas is introduced into the process chamber through the supply passage and the gas ejection holes of the shower plate.

In the foregoing plasma processing apparatus having the radial line slot antenna, the uniform high-density plasma is formed in the space immediately below the shower plate. The high-density plasma thus formed has a low electron temperature. Therefore, no damage occurs to the processing substrate and no metal contamination occurs due to sputtering of the wall of the process container either.

On the other hand, a number of the gas ejection holes of the same size are equally and uniformly disposed in the shower plate. In other words, the distribution and size of the gas ejection holes arranged in the shower plate are uniform over the entire surface of the shower plate.

According to experiments by the present inventors, it has been found that, using a shower plate with gas ejection holes of the same size uniformly distributed over the entire surface, when the film formation process such as CVD (Chemical Vapor Deposition) is carried out, the thickness of a film formed on a substrate becomes unequal, while, when the etching process such as (RIE) (Reactive Ion Etching) is carried out, the etching rate becomes unequal. Further, it has also been found that there arise problems of unstabilization of the process, degradation in yield, and degradation in throughput due to process gas deposition on the shower plate.

An object of this invention is to provide a technique for clearing up the cause of various faults inherent to the foregoing plasma processing apparatus and enabling to reduce those faults.

A specific object of this invention is to provide a plasma processing apparatus or a semiconductor manufacturing apparatus that can realize uniform film formation or uniform etching rate.

A further specific object of this invention is to provide a shower plate that serves to realize uniform film formation or uniform etching rate.

Another object of this invention is to provide a method of manufacturing a product by the use of the foregoing shower plate.

DISCLOSURE OF THE INVENTION

As a result of assiduously examining the cause of the foregoing faults, the present inventors have found the following fact. When use is made of a shower plate with gas ejection holes of the same size uniformly distributed, a gas from the gas ejection holes disposed at its peripheral portion is also irradiated onto a processing substrate at its center portion. Therefore, the amount of gas molecules reaching the processing substrate per unit time and per unit area becomes greater at the center portion of the processing substrate than at its peripheral portion, so that the gas jet flow becomes unequal at a distance away from the shower plate and hence the in-plane uniformity cannot be ensured. A problem has also been found that if, in this manner, the gas ejection from the shower plate is disturbed, a gas jetted from process gas ejection nozzles formed in a conductor construction reaches a space between the shower plate and the conductor construction where a high-density plasma is formed, resulting in excessive dissociation of the process gas or deposition thereof onto the shower plate.

In view of this, in this invention, there are proposed a shower plate that enables uniform gas supply in the plane of a processing substrate, a plasma processing apparatus including such a shower plate, and a manufacturing method using such a plasma processing apparatus.

According to one aspect of this invention, there is obtained a shower plate having a plurality of ejection holes adapted to eject a gas, the shower plate characterized in that the total area of the ejection holes per unit area at a center portion of the shower plate and the total area of the ejection holes per unit area at a peripheral portion thereof differ from each other. Specifically, the total area of the ejection holes per unit area at the center portion of the shower plate is smaller than the total area of the ejection holes per unit area at the peripheral portion thereof.

According to another aspect of this invention, there is obtained a shower plate having a plurality of ejection holes adapted to eject a gas, the shower plate characterized in that a hole area of each of the ejection holes at a center portion of the shower plate is smaller than a hole area of each of the ejection holes at a peripheral portion thereof.

According to still another aspect of this invention, there is obtained a shower plate having a plurality of ejection holes adapted to eject a gas, the shower plate characterized in that the number of the ejection holes per unit area at a center portion of the shower plate is smaller than the number of the ejection holes per unit area at a peripheral portion thereof.

According to another aspect of this invention, there is obtained a shower plate having a plurality of ejection holes adapted to eject a gas, the shower plate characterized in that an interval of the ejection holes at a center portion of the shower plate is shorter than an interval of the ejection holes at a peripheral portion thereof.

Further, according to another aspect, there is obtained a shower plate having a plurality of ejection holes adapted to eject a gas, the shower plate characterized in that the ejection holes are arranged concentrically and an interval of the ejection holes at a center portion of the shower plate is shorter than an interval of the ejection holes at a peripheral portion thereof.

According to another aspect of this invention, there is obtained a shower plate having a plurality of ejection holes adapted to eject a gas, the shower plate characterized in that the ejection hole has a portion, on the side where the gas flows into the hole, having a width which is more than 0.5 mm and is not more than 5 mm and a portion, on the side where the gas flows out of the hole, having a width which is not less than 0.02 mm, preferably not less than 0.05 mm, and is not more than 1 mm, preferably not more than 0.5 mm.

The shower plate of this invention is characterized in that a diameter of each ejection hole on the gas flow-out side is not more than twice a plasma sheath thickness. Further, the ejection hole is characterized by changing a diameter thereof from the gas flow-in side toward the gas flow-out side.

Further, the shower plate of this invention is characterized in that fluctuation in hole diameter of the ejection holes at least on the gas flow-out side is not more than 1% and preferably not more than 0.25% over the entire shower plate. Further, the shower plate is characterized in that, of both surfaces of the shower plate, at least the surface on the side where the gas flows out is not a flat surface, for example, the peripheral portion of the surface of the shower plate on the side where the gas flows out is projected over the center portion thereof or the peripheral portion of the shower plate has a thickness greater than that of the center portion. The center axis of at least a portion, on the side where the gas flows out, of each of at least part of the plurality of ejection holes may be inclined with respect to a normal of a surface, which is to face an object to be processed, of at least a center portion of the shower plate. Preferably, inclination of the center axis is set such that the gas is ejected from the at least part of the plurality of ejection holes in a direction towards the center of the shower plate and in a direction towards the side where the object to be processed is to be placed. Further, it is also one of the features of this invention that means for introducing the gas from the exterior to a surface of the shower plate on the side where the gas flows into the ejection holes is provided at a peripheral portion of the shower plate, not at its center portion.

The foregoing shower plate is used in a plasma processing apparatus. Further, the foregoing shower plate is used in a plasma processing method and in the manufacture of a semiconductor device or a display device applied with plasma processing.

BRIEF DESCRIPTION OF THE DRAWINGS

FIGS. 4(a) and 4(b) are a plan view and a sectional view, respectively, for specifically explaining a shower plate shown in FIG. 3.

BEST MODE FOR CARRYING OUT THE INVENTION

At first, the principle of this invention will be described.

A velocity u(r, z), when a gas is ejected from a hole with a radius $b_0$, is given by the following formula (1) by solving the Navier-Stokes equation.

$$u(r,z) = \frac{3\rho U_0^2 b_0^2}{8\mu z \left(1 + \frac{3\rho 2 U_0^2 b_0^2 r^2}{64\mu^2 z^2}\right)^2} \quad (1)$$

Herein, r represents a radial distance from a center axis of the hole and z a distance on the center axis from an outlet of the hole. Further, $\mu$, $\rho$, and $U_0$ are a viscosity coefficient of the gas, a mass density of the gas, and an initial velocity of the gas in the ejection hole. Simultaneously, the distance over which the gas spreads from the hole is, when defined in terms of $b_{1/2}$, given by the following formula (2).

$$b_{1/2}(z) = 23.1 \frac{z}{\sqrt{PQ}} \quad (2)$$

Herein, P represents a gas pressure (mTorr) and Q a gas flow rate (sccm). The width $b_{1/2}$ represents, in radial velocity distribution of the gas, a radial position where the velocity becomes half the velocity on the center axis, i.e. a half-width of the gas velocity.

Figure 1:
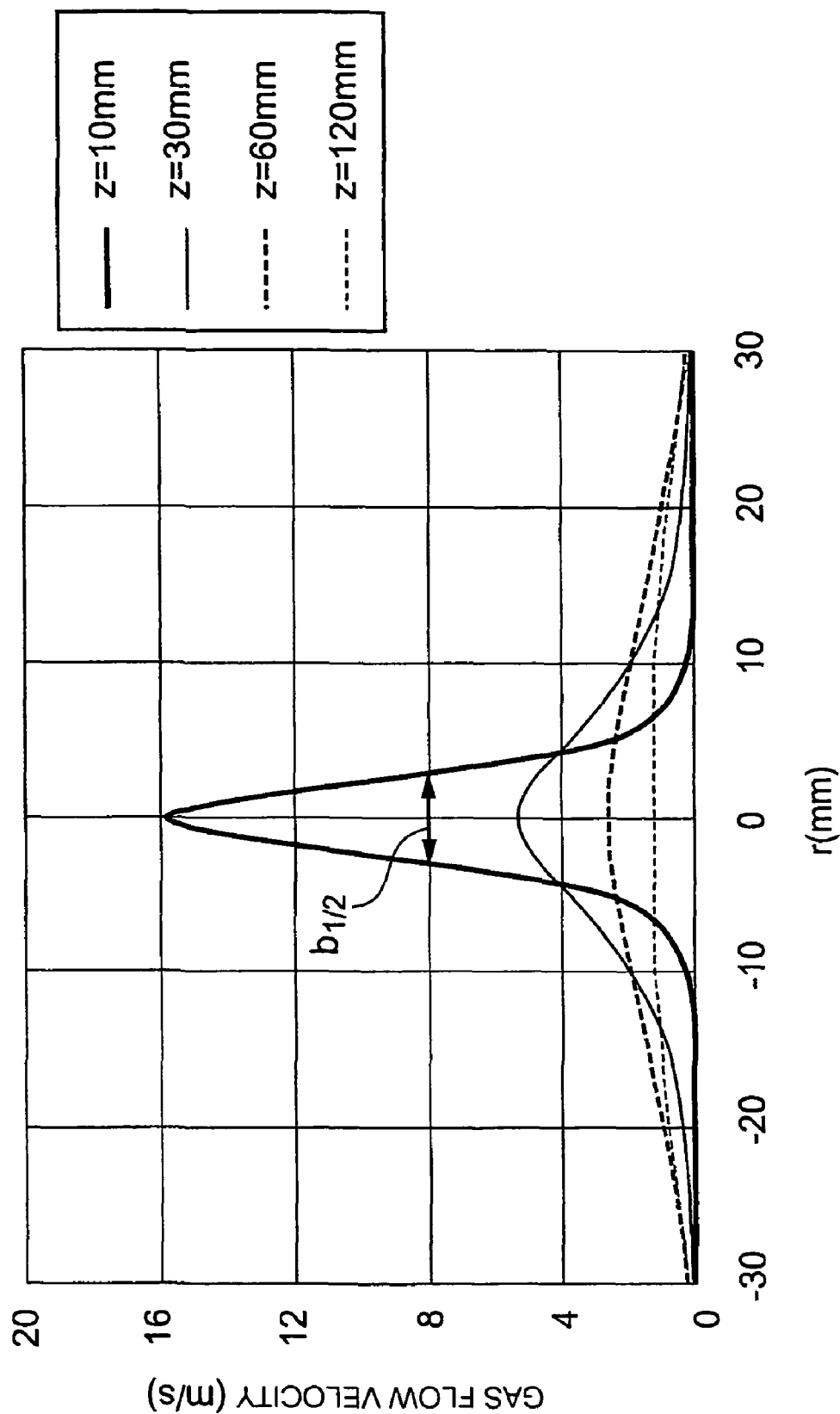
FIG. 1 is a graph for explaining the subject in this invention and is a graph showing gas jet flow velocity distributions.

FIG. 1 shows an example of gas velocity distributions at various positions z in the case where the pressures is 1 Torr, the gas ejection hold diameter is Φ0.2 mm, and an Ar gas is jetted.

As clear from FIG. 1, the distribution of the gas jetted from the ejection hole spreads in proportion to the distance z.

Figure 2:
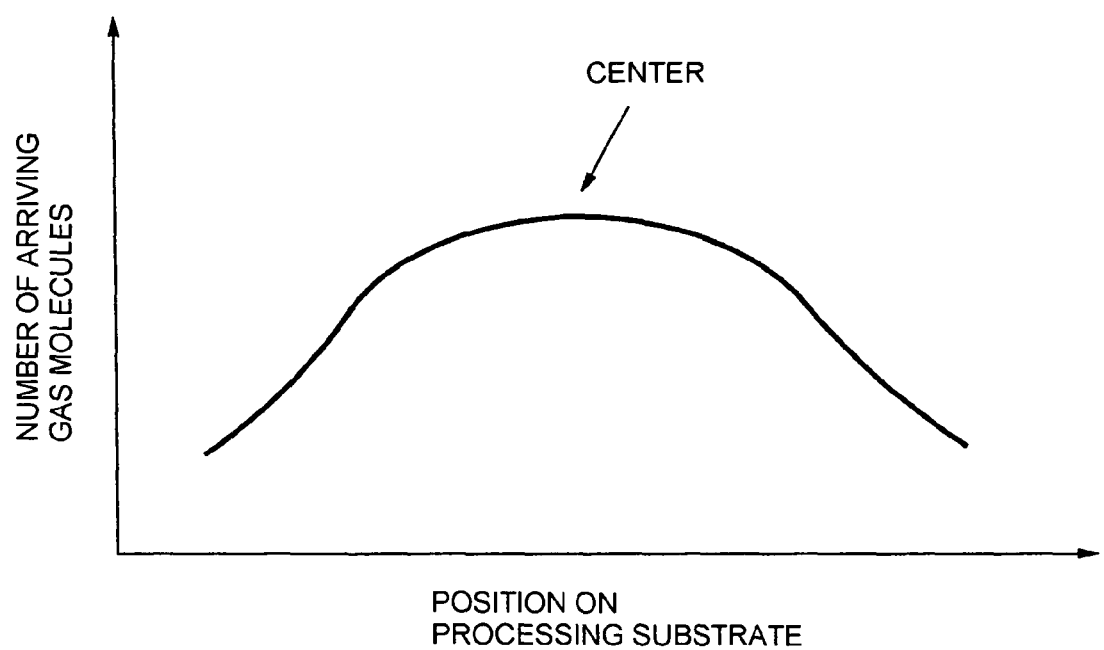
FIG. 2 is a graph showing the substrate position dependence of the number of gas molecules reaching a substrate per unit time/unit area in the conventional technique.

FIG. 2 shows analysis results based on the foregoing formulas (1) and (2) when holes are arranged uniformly per unit area over the entire surface of a shower plate. As shown in FIG. 2, more gas molecules reach a center portion of a processing substrate as compared with its peripheral portion.

Based on the foregoing results, in this invention, the distribution of gas ejection holes is changed between at a center portion of a shower plate and at its peripheral portion. Specifically, by increasing the arrangement number per unit area as going away from the center in radial direction or by increasing the area of the ejection holes in radial direction away from the plate center, it is possible to uniformalize the in-plane distribution of gas molecules reaching a processing substrate.

To explain this more specifically, at first, a gas flow rate Q ejected from a gas ejection hole is given by the following formula (3).

$$Q = 1349 \times d^4 / L \times (P_1 \cdot P_0) \times (P_1 + P_0)/2 (Pa \cdot m^3/s) \quad (3)$$

Herein, d represents a diameter of the ejection hole, L a length of the hole, and $P_1$ and $P_0$ a pressure on the inlet side and a pressure on the outlet side of the hole, respectively.

It is necessary to design the diameter of the gas ejection hole so that a high-density plasma does not enter the hole. If the plasma flows into the gas ejection hole, abnormal discharge or deposition of the gas occurs, thereby causing degradation in microwave transmission efficiency and in yield. In order to prevent them, the hole diameter should be set to not more than twice a plasma sheath thickness. Assuming that the plasma sheath thickness is d, it is given by the following formula (4).

$$d = 1.307 \times \lambda_D \left[ \frac{1}{2} \left\{ 1 + \ln\left(\frac{m_i}{2\pi m_e}\right) \right\} \right]^{\frac{3}{4}} \quad (4)$$

Herein, $m_i$ and $m_e$ represent a plasma ion mass and an electron mass, respectively. $\lambda_D$ represents a Debye length and is given by the following formula (5).

$$\lambda_D = \sqrt{\frac{\varepsilon_0 k T_e}{n_e e^2}} \quad (5)$$

Herein, $\varepsilon_0$ represents a permittivity of free space, k a Boltzmann's constant, $T_e$ an electron temperature, $n_e$ a plasma electron density, and e a unit charge. Since the sheath thickness given by these formulas changes from approximately 0.01 mm to 5 mm according to gas species, electron temperature, and electron density of a plasma to be used, the hole diameter should be set to, depending on the value, not less than 0.02 mm and not more than 10 mm that becomes not more than twice the sheath thickness. When the hole diameter is not more than twice the plasma sheath thickness as described above, it is possible to prevent the plasma from entering the hole from the gas ejection side. However, the diameter is preferably set to not more than 0.5 mm, and more preferably 0.1 mm to 0.3 mm. Further, in consideration of the conductance of gas flow, it is preferably set to not less than 0.05 mm. Then, the hole having a diameter of preferably not less than 0.05 mm and not more than 0.5 mm is provided on the gas flow-out side, i.e. on the plasma generation side, in a length of 0.2 mm to 2 mm, while, the other portion, i.e. on the gas flow-in side, has a larger diameter more than 0.5 mm and not more than 5 mm. With the configuration of this degree, it is possible to prevent excitation of the plasma in the hole. Naturally, depending on the plasma sheath thickness, it may be not more than 10 mm. On the other hand, the thickness of the shower plate is preferably not less than 20 mm in terms of mechanical strength for vacuum seal, while, is preferably not more than 30 mm in terms of manufacturing facilitation.

It is preferable that the conductance of a space between the shower plate and a cover plate be set sufficiently larger than that of the gas ejection hole because if a pressure differential occurs in the space, gas flow rate control becomes difficult based on the formula (3). Accordingly, the pressures at its center portion and at its peripheral portion are substantially the same.

It is understood that, from the formula (3), the gas flow rate from the ejection hole is proportional to the fourth power of the hole diameter and, from the formula (2), the half-width of the gas velocity spread is inversely proportional to the square root of the gas flow rate. Therefore, the gas velocity spread is inversely proportional to the square of the hole diameter. From this, by making larger the diameter of each of gas ejection holes at the peripheral portion of the shower plate than at its center portion, the gas velocity spread can be suppressed to thereby realize uniformalization of the distribution of the number of gas molecules reaching the processing substrate per unit time/unit area. Alternatively, assuming that all the holes have the same area, the uniformalization is enabled by increasing the number of ejection holes per unit area in radial direction from the plate center.

Figure 16:
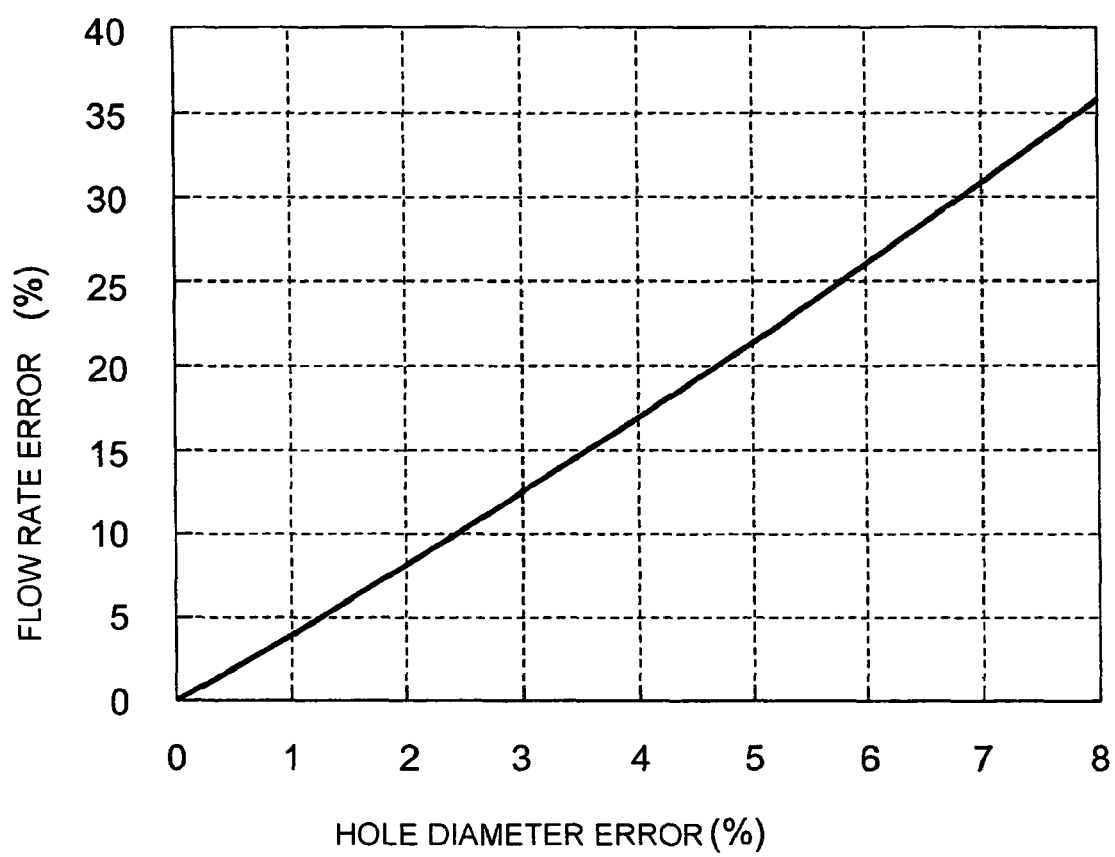
FIG. 16 is a graph showing the relationship between gas ejection hole diameter error and gas flow rate error in a shower plate of this invention.

The gas flow rate ejected from the gas ejection hole is proportional to the fourth power of the hole diameter. FIG. 16 shows the hole diameter error dependence of flow rate error. Since the process uniformity (uniformity in film formation thickness, uniformity in etching amount, etc.) of a plasma processing object degrades corresponding to the flow rate error, it is preferable that the hole diameter error be not more than 1% in order to suppress the process uniformity not more than 4%. It is desirable to suppress the hole diameter error not more than 0.25%, thereby suppressing the process uniformity to 1%.

Hereinbelow, embodiments of this invention will be described with reference to the drawings.

FIRST EMBODIMENT

Figure 3:
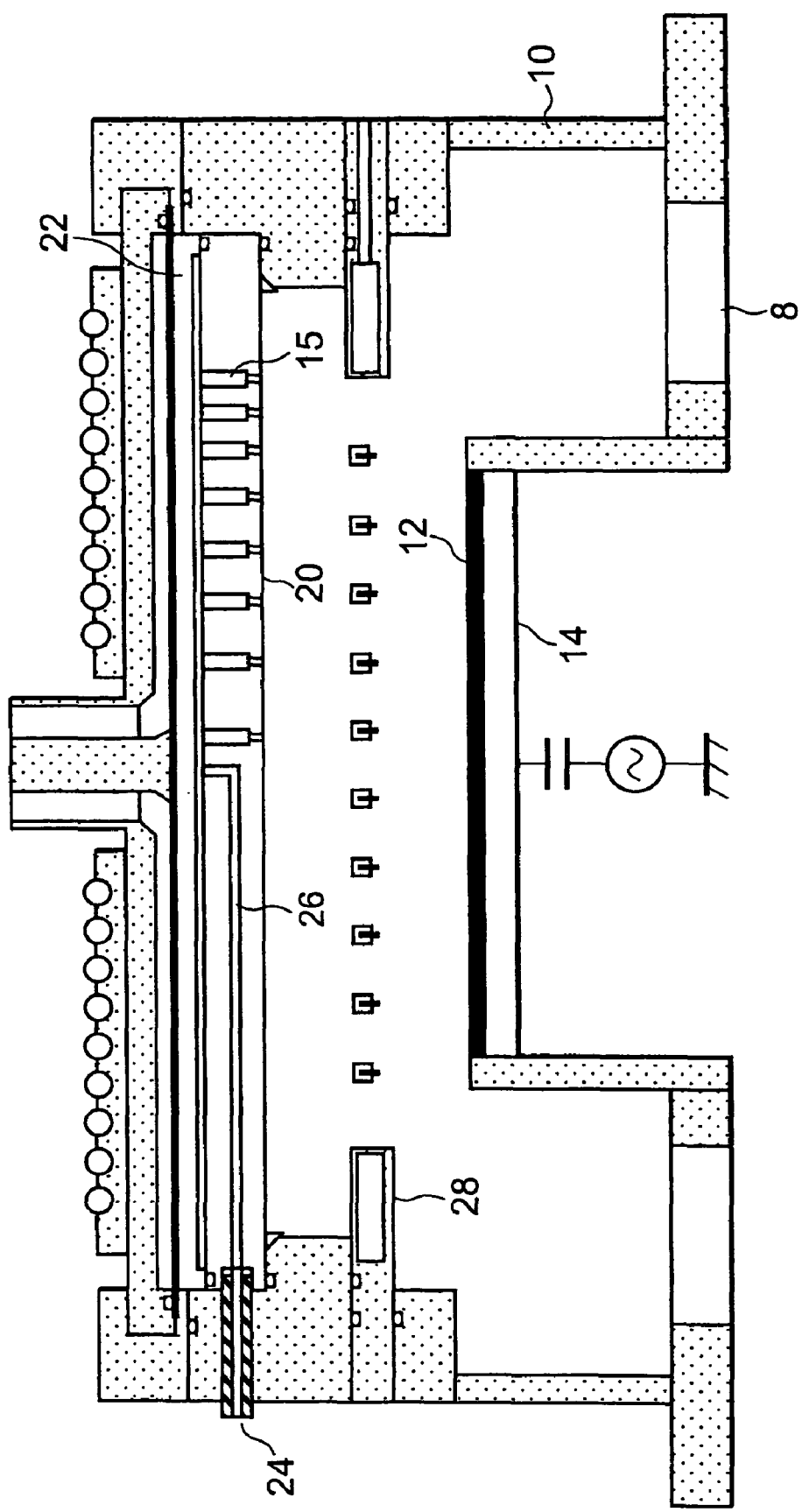
FIG. 3 is a diagram showing a schematic structure of a microwave plasma processing apparatus according to this invention.

Referring to FIG. 3, there is shown a microwave plasma processing apparatus for RIE (Reactive Ion Etching) process.

The illustrated microwave plasma processing apparatus has a process chamber 10 that is evacuated through a plurality of exhaust ports 8. In the process chamber 10, a holding platform 14 for holding a processing substrate 12 is disposed. In order to uniformly evacuate the process chamber 10, a ring-shaped space is defined around the holding platform 14 in the process chamber 10 and the plurality of exhaust ports 8 are arranged at regular intervals, i.e. axisymmetrically to the processing substrate 12, so as to communicate with the space. By this arrangement of the exhaust ports 8, the process chamber 10 can be uniformly evacuated through the exhaust ports 8.

Over the process chamber 10, a plate-shaped shower plate 20 made of a dielectric (alumina is preferable) with a low microwave dielectric loss and formed with a number of opening portions, i.e. gas ejection holes 15, is attached, as part of an outer wall of the process chamber 10, through a seal ring at a position corresponding to the processing substrate 12 on the holding platform 14. Further, over the process chamber 10, a cover plate 22 made of, similarly, a dielectric with a low microwave dielectric loss is attached through another seal ring on the outer side of the shower plate 20, i.e. on the side opposite to the holding platform 14 with respect to the shower plate 20.

A plasma gas space for filling a plasma excitation gas therein is formed between an upper surface of the shower plate 20 and the cover plate 22, and the plurality of gas ejection holes 15 are each formed so as to communicate with the plasma gas space. Further, inside the shower plate 20 is formed a plasma gas supply passage 26 communicating with a plasma gas supply port 24 provided in the outer wall of the process chamber 10. The plasma excitation gas such as Ar or Kr supplied to the plasma gas supply port 24 is supplied to the gas ejection holes 15 from the supply passage 26 through the plasma gas space and introduced to an upper space in the process chamber 10.

In the illustrated plasma processing apparatus, a conductor construction 28 is disposed between the shower plate 20 and the processing substrate 12 in the process chamber 10. This conductor construction 28 is formed with a number of nozzles for supplying a process gas from an external process gas source (not shown) through a process gas passage formed in the process chamber 10. The nozzles of the conductor construction 28 each eject the supplied process gas into a lower space between the conductor construction 28 and the processing substrate 12. The conductor construction 28 is formed, between the adjacent nozzles, opening portions each having a size to efficiently pass by diffusion the plasma formed in the upper space.

When the process gas is ejected into the lower space from the conductor construction 28 having such a structure through the nozzles, the ejected process gas is excited by the high-density plasma formed in the upper space. However, since the plasma excitation gas from the shower plate 20 flows toward the lower space between the conductor construction 28 and the processing substrate 12 from the upper space between the shower plate 20 and the conductor construction 28, components of the process gas that return to the upper space between the shower plate 20 and the conductor construction 28 are small in amount, so that decomposition of gas molecules due to excessive dissociation caused by exposure to the high-density plasma is small in amount, thereby enabling high-quality substrate processing.

Referring to FIGS. 4(a) and 4(b), the structure of the shower plate 20 shown in FIG. 3 will be described in more detail. The shower plate 20 shown in FIG. 4(a) has a diameter of 361 mm. The surface region of the shower plate 20 can be divided into a center portion 20a having a diameter of 80 mm and its peripheral portion 20b. In this example, the center portion 20a is provided with four gas ejection holes 15, while, the peripheral portion 20b is provided with 16 gas ejection holes 15 at a position of a diameter 210 mm. Further, the peripheral portion 20b is provided with 24 gas ejection holes 15 at a position of a diameter 310 mm. In this example, it is assumed that each gas ejection hole 15 has the same size.

As clear from this, in the illustrated shower plate 20, the number of gas ejection holes 15 increases as going outward from the center portion 20a. In other words, in the example shown in FIG. 4(a), it is understood that the number of gas ejection holes 15 increases depending on the distance from the center of the shower plate 20. That is, the distribution of the gas ejection holes 15 at the peripheral portion 20b is higher than that of the gas ejection holes 15 at the center portion 20a. Note that, in order to simplify the description of this invention, the number of gas ejection holes 15 is shown extremely smaller than the actual number in FIG. 4.

As shown in FIG. 4(b), each of the gas ejection holes 15 provided in the shower plate 20 has an opening with a diameter of 1 mm on the cover plate side and an opening with a diameter of 0.1 mm on the space side of the process chamber 10. Further, the opening depth of the gas ejection hole 15 on the cover plate 22 side is 19 mm, while, the opening depth of the gas ejection hole 15 on the space side is 1 mm.

Figure 5:
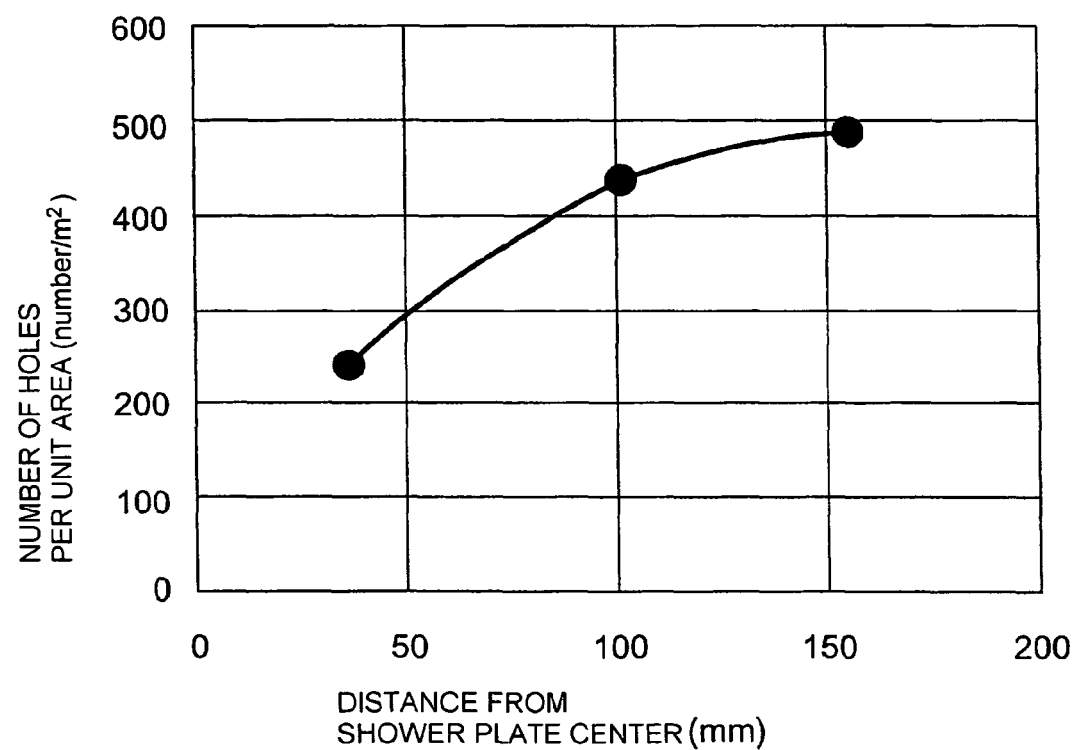
FIG. 5 is a diagram for explaining the dependence between the number of holes per unit area in the shower plate and the distance from the center of the shower plate according to this invention.

Referring to FIG. 5, there is shown the relationship between the distance from the center of the shower plate 20 and the number of gas ejection holes 15. Herein, the axis of abscissas represents the distance from the center of the shower plate and the axis of ordinates represents the number of gas ejection holes per unit area (number/m$^2$). As clear from the figure, approximately 300 gas ejection holes per unit area m$^2$ are formed at a position of 50 mm from the center, approximately 450 gas ejection holes per unit area m$^2$ are formed at a position of 100 mm from the center, and approximately 490 gas ejection holes per unit area m$^2$ are formed at a position of 150 mm from the center. In this manner, the shower plate according to this invention has the arrangement of the gas ejection holes that increase as going outward of the shower plate 20. In other words, the arrangement of the gas ejection holes of the shower plate according to this invention has the radial direction dependence. The function form of this graph is $$y = -0.0173x^2 + 5.3574x + 71.517.$$

Figure 6:
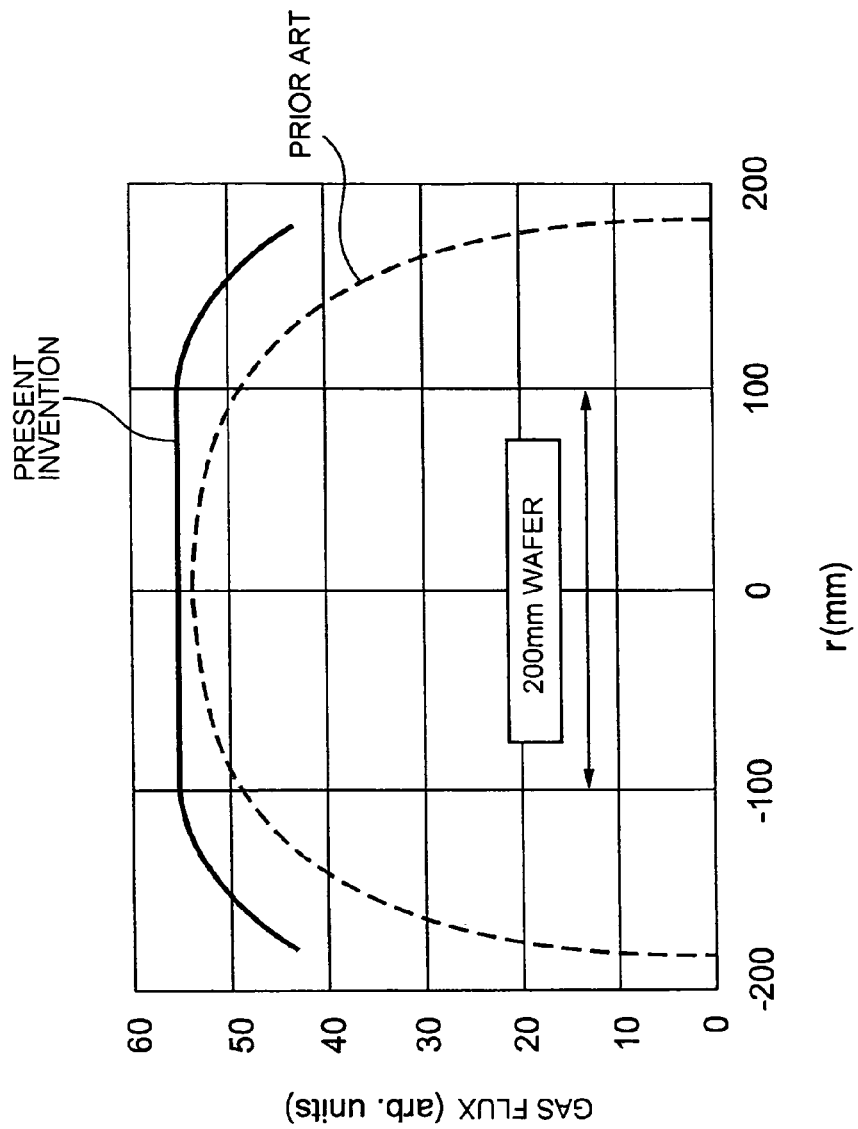
FIG. 6 is a graph showing the dependence of gas flux on the distance from a substrate in this invention and the conventional technique.

Referring to FIG. 6, there is shown wafer in-plane distribution of the number of gas molecules arriving on a 200 mm wafer per unit time/unit area when plasma processing is applied to the wafer by the use of the shower plate according to this invention. As shown in the figure, uniformity is 2.9% when the conventional shower plate is used, while, higher uniformity (0.23%) can be realized by the use of the shower plate of this invention.

SECOND EMBODIMENT

Figure 7A:
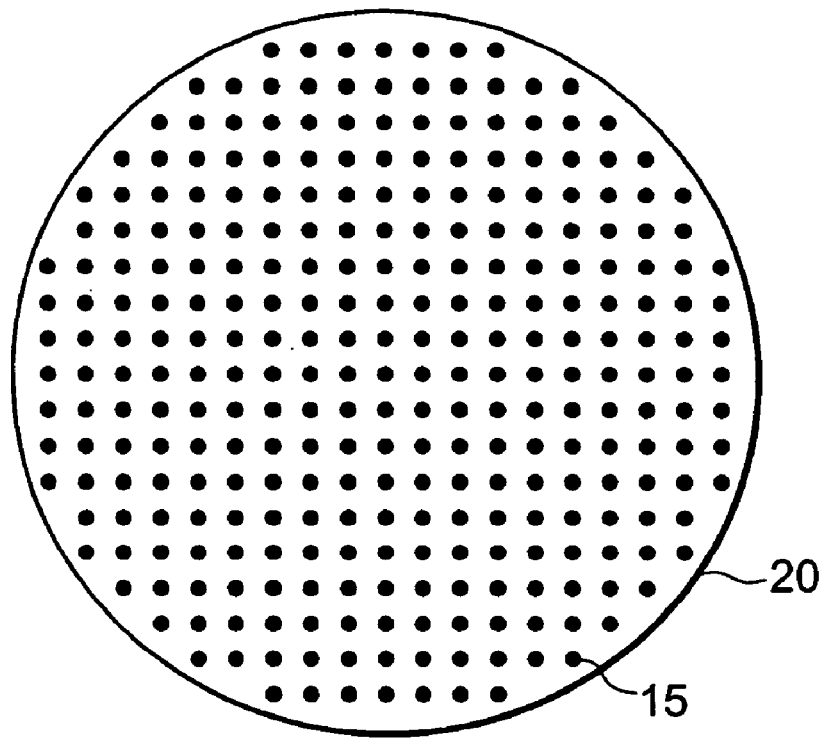
FIGS. 7(a) and 7(b) are a top view and a sectional view, respectively, of a shower plate for use in a microwave plasma processing apparatus according to a second embodiment of this invention.
Figure 7B:
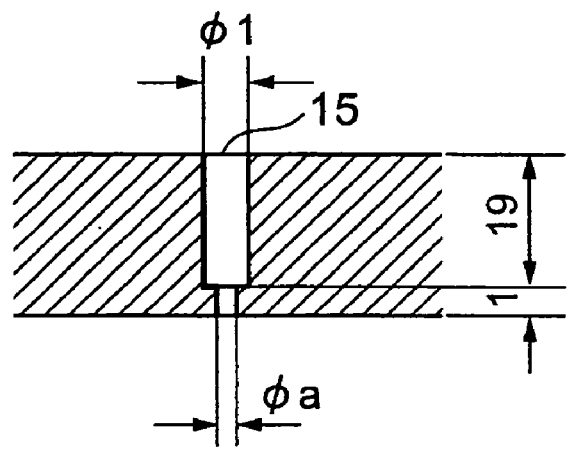

Referring to FIGS. 7(a) and 7(b), there is shown a shower plate 20 suitable for a microwave plasma processing apparatus for CVD and oxynitride film process. Since the structure itself of the entire microwave plasma processing apparatus for CVD and oxynitride film process is the same as that in FIG. 3, explanation thereof is omitted herein. The shower plate 20 used in this microwave plasma processing apparatus has a diameter of 400 mm and a thickness of 20 mm. Gas ejection holes 15 are provided at intervals of 20 mm. The shower plate 20 shown in FIG. 7(a) has the gas ejection holes 15 that increase in diameter as going outward of the shower plate 20. In other words, the illustrated shower plate 20 has the structure in which the diameters of the gas ejection holes 15 increase as going outward of the shower plate.

Figure 8:
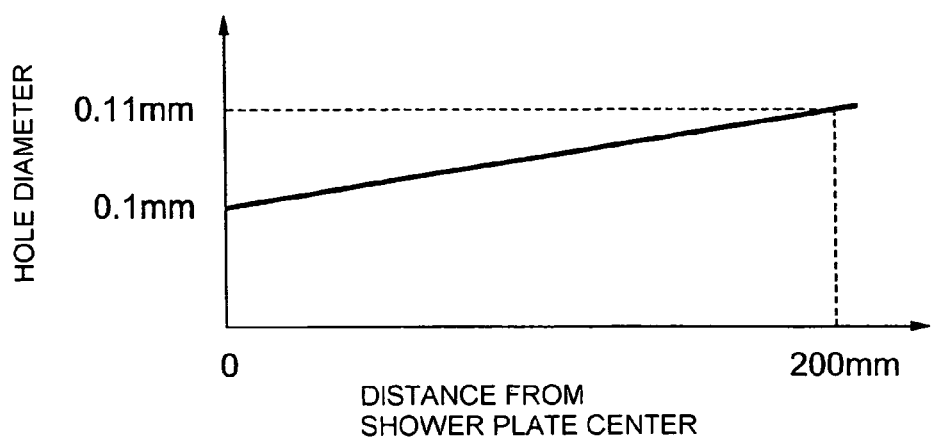
FIG. 8 is a diagram showing the relationship between the diameter of a gas ejection hole formed in the shower plate and the distance from the center of the shower plate according to the second embodiment of this invention.

FIG. 7(b) shows one example of the single gas ejection hole 15, wherein the illustrated gas ejection hole 15 has an opening with a diameter of 1 mm from the cover plate side and an opening with a diameter of a (mm) on the process chamber side. The opening depth on the cover plate side is 19 mm, while, the opening depth on the process chamber side is 1 mm. Herein, as shown in FIG. 8, the diameter a is configured such that the opening diameters increase in the range of 0.1 to 0.11 mm as going outward of the shower plate.

Figure 9:
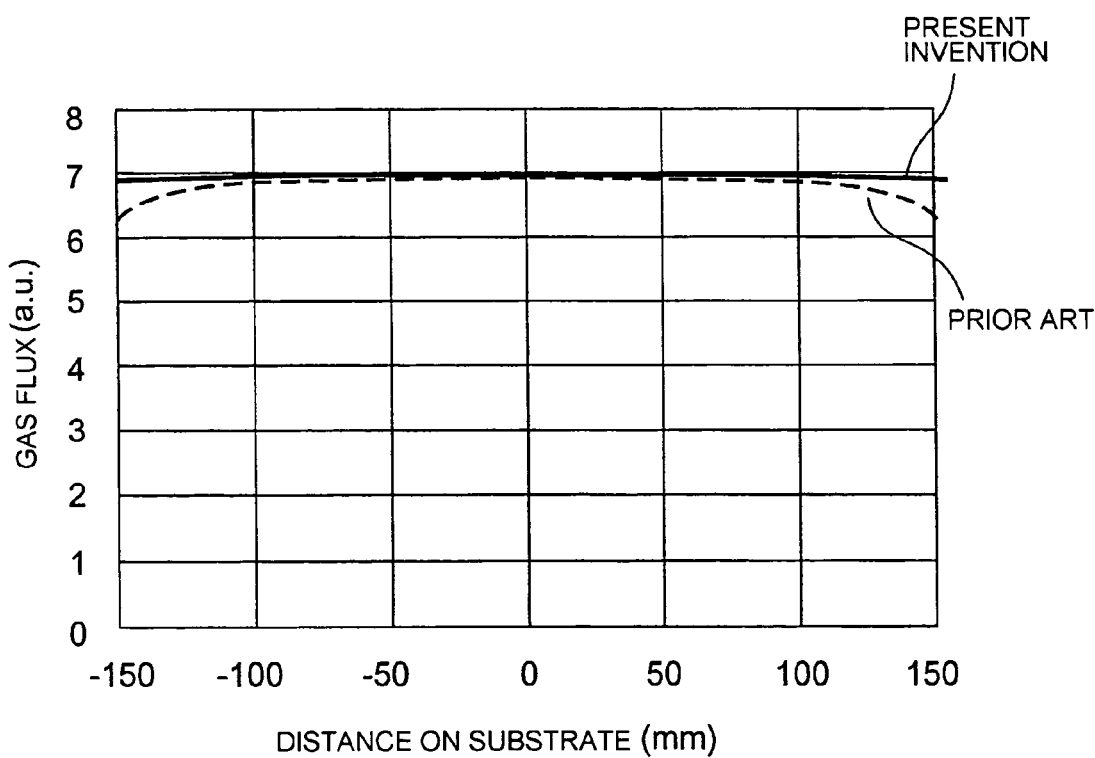
FIG. 9 is a graph showing the relationship between the gas flux and the distance from the center of a substrate in this invention and the conventional technique.

When a 300 mm wafer is processed using such a shower plate 20, the results shown in FIG. 9 are obtained. That is, FIG. 9 shows wafer in-plane distribution of the number of gas molecules arriving on the wafer per unit time/unit area. Uniformity is 1.9% with the conventional structure, while, when use is made of the shower plate having the structure of this invention in which the opening diameters increase as going outward, there is obtained a highly uniform arriving gas distribution of 0.9% in this invention.

THIRD EMBODIMENT

A shower plate according to the third embodiment of this invention is applied to a microwave plasma processing apparatus for RIE. In this case, the microwave plasma processing apparatus for RIE differs from the plasma processing apparatus according to the first embodiment in that $C_5F_8$, $O_2$, and Ar are ejected as a process gas into a space through nozzles of a conductor construction 28.

In a shower plate 20 used in such a microwave plasma processing apparatus for RIE, the number of gas ejection holes per unit area is arranged so as to have the radial direction dependence like in the shower plate 20 shown in FIGS. 5 and 6. Further, an Ar gas is filled as a plasma excitation gas in a space at an upper surface of the shower plate 20 of this embodiment and this Ar gas is supplied to the gas ejection holes 20 through a supply passage and introduced into a process chamber 10.

Also in the microwave plasma processing apparatus for RIE of this structure, the uniform gas flow can be realized and the process gas does not return to a space between the shower plate 20 and the conductor construction 28 to thereby prevent excessive dissociation of the process gas, so that the high aspect ratio contact hole etching can be uniformly carried out at a high etching rate.

In the embodiments described above, the description has been made only about the case where the semiconductor wafer is processed as the processing substrate. However, this invention is not at all limited thereto and is also applicable to processing of a substrate for a liquid crystal display device, an organic EL display device, or the like. Further, the change in the number or diameter of gas ejection holes from the center to the periphery of the shower plate may be performed continuously or discontinuously.

FOURTH EMBODIMENT

Figure 10:
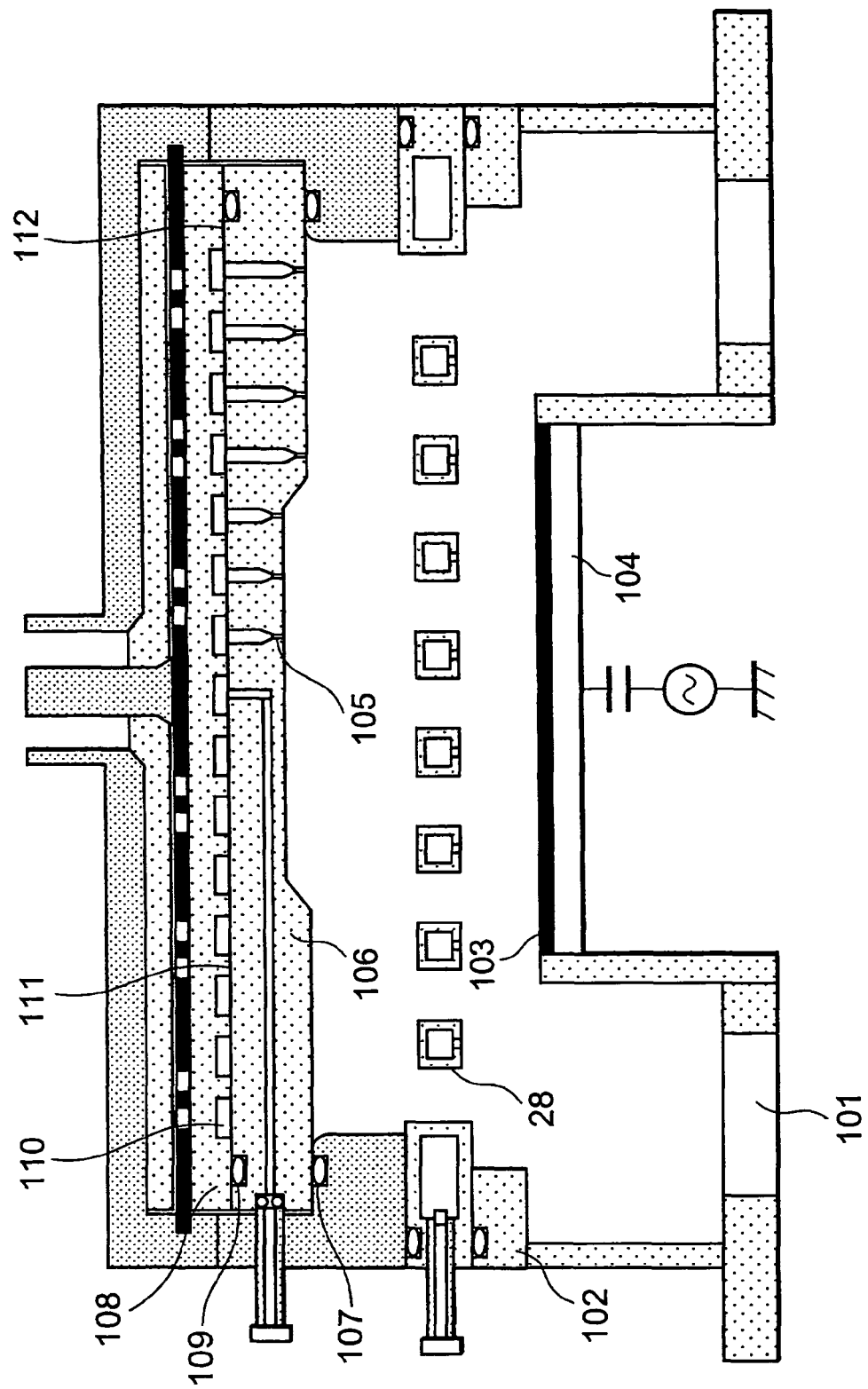
FIG. 10 is a diagram showing a schematic structure of a microwave plasma processing apparatus according to a fourth embodiment of this invention.

Referring to FIG. 10, there is shown a microwave plasma processing apparatus for PECVD (Plasma-Enhanced Chemical Vapor Deposition) process. The illustrated microwave plasma processing apparatus has a process chamber 102 that is evacuated through a plurality of exhaust ports 101. In the process chamber 102, a holding platform 104 for holding a processing substrate 103 is disposed. In order to uniformly evacuate the process chamber 102, a ring-shaped space is defined around the holding platform 104 in the process chamber 102 and the plurality of exhaust ports 101 are arranged at regular intervals, i.e. axisymmetrically to the processing substrate 103, so as to communicate with the space. By this arrangement of the exhaust ports 101, the process chamber 102 can be uniformly evacuated through the exhaust ports 101.

Over the process chamber 102, a plate-shaped shower plate 106 made of dielectric alumina with a relative permittivity of 9.8 and a low microwave dielectric loss (dielectric loss is not more than $1 \times 10^{-4}$) and formed with a number of (238) opening portions, i.e. gas ejection holes 105, is attached, as part of an outer wall of the process chamber 102, through a seal ring 107 at a position corresponding to the processing substrate 103 on the holding platform 104. Further, over the process chamber 102, a cover plate 108 made of alumina is attached through another seal ring 109 on the outer side of the shower plate 106, i.e. on the side opposite to the holding platform 104 with respect to the shower plate 106. A space 110 for filling a plasma excitation gas therein is formed between an upper surface of the shower plate 106 and the cover plate 108. In other words, in the cover plate 108, a number of projections 111 are formed on a surface of the cover plate 108 on the side of the shower plate 106 and further a projecting ring 112 projecting so as to be flush with the projections 111 is formed at the periphery of the cover plate 108, so that the space 110 is formed between the shower plate 106 and the cover plate 108. The gas ejection holes 105 are arranged at positions corresponding to the space 110.

Figure 11A:
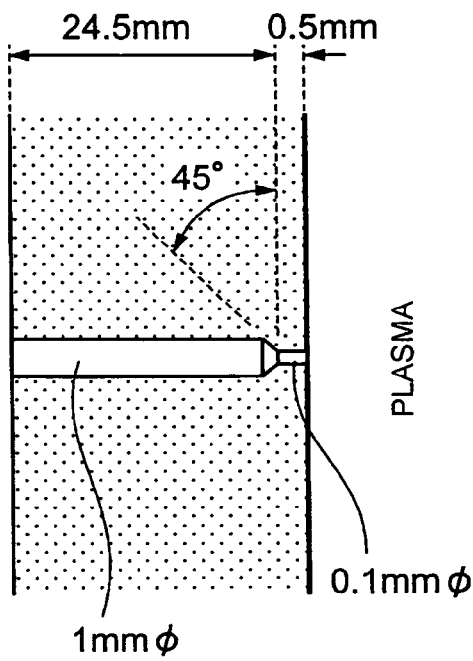
FIGS. 11 (a) and 11(b) are sectional views for specifically explaining holes of a shower plate, respectively.
Figure 11B:
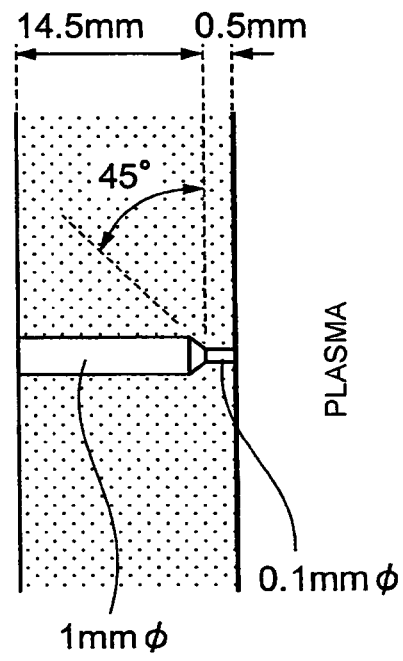

The shower plate 106 has a diameter of 360 mm and a thickness of 25 mm at its peripheral portion. Within a diameter of 150 mm, it has a structure hollowed by 10 mm. In other words, the thickness is set to 15 mm within the diameter of 150 mm. Since the periphery of the hollow portion has a 45° tapered structure, the thickness outside a diameter of 170 mm becomes 25 mm. The angle of the taper is not limited to 45° and it is desirable that corners of the taper be rounded to provide a structure adapted to suppress the electric field concentration. FIGS. 11(a) and 11(b) are sectional views of the gas ejection holes 105 formed in the shower plate 106. FIG. 11(a) shows the gas ejection hole 105 formed at a position not at the hollow portion (outside the diameter of 150 mm in the shower plate 106). A hole having a diameter of 0.1 mm and a length of 0.5 mm is formed on the side of the process chamber 102 where a plasma is excited, and is connected to a hole having a diameter of 1 mm through a 45° tapered portion. The length of a hole in the combination of the hole having the diameter of 1 mm and the tapered portion becomes 24.5 mm. FIG. 11(b) is the sectional view of the gas ejection hole 105 formed at the hollow portion (inside the diameter of 170 mm in the shower plate 106). A hole having a diameter of 0.1 mm and a length of 0.5 mm is formed on the side of the process chamber 102 where the plasma is excited, and is connected to a hole having a diameter of 1 mm through a 45° tapered portion. The length of a hole in the combination of the hole having the diameter of 1 mm and the tapered portion becomes 14.5 mm. In this embodiment, the tapered structure portion is not formed with a gas ejection hole. However, the tapered structure portion may be formed with a gas ejection hole.

Figure 12:
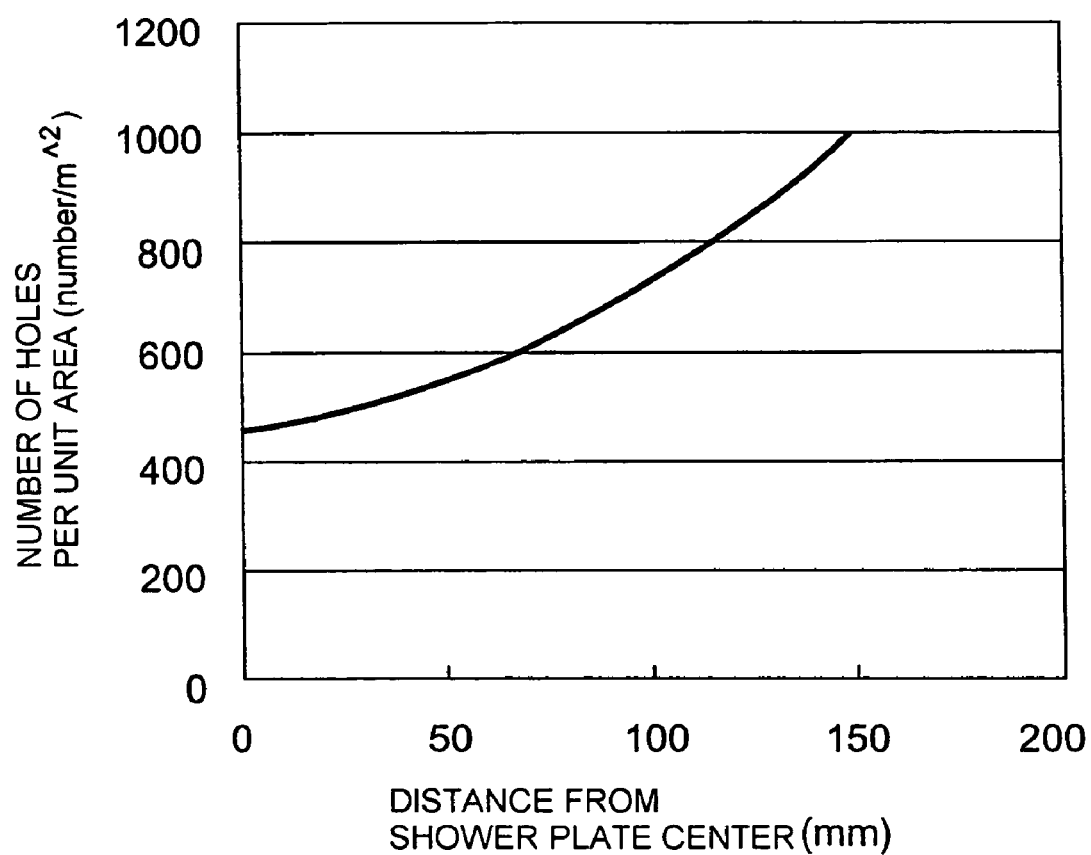
FIG. 12 is a diagram for explaining the dependence between the number of holes per unit area in the shower plate and the distance from the center of the shower plate.

Referring to FIG. 12, there is shown the relationship between the number of gas ejection holes 105 per unit area formed in the shower plate 106 and the distance from the center of the shower plate in this embodiment. The function form of this graph is $$y = 0.018x^2 + 0.71x + 467.2.$$

The arrangement of the gas ejection holes has the radial direction dependence, wherein the arrangement number of gas ejection holes per unit area increases as going outward of the shower plate 106.

By the use of the shower plate according to this invention, it is possible to carry out uniform gas supply to the processing substrate 103 and simultaneously achieve uniform plasma arrival distribution, thereby enabling uniform processing on the upper surface of the processing substrate 103.

FIFTH EMBODIMENT

Figure 13:
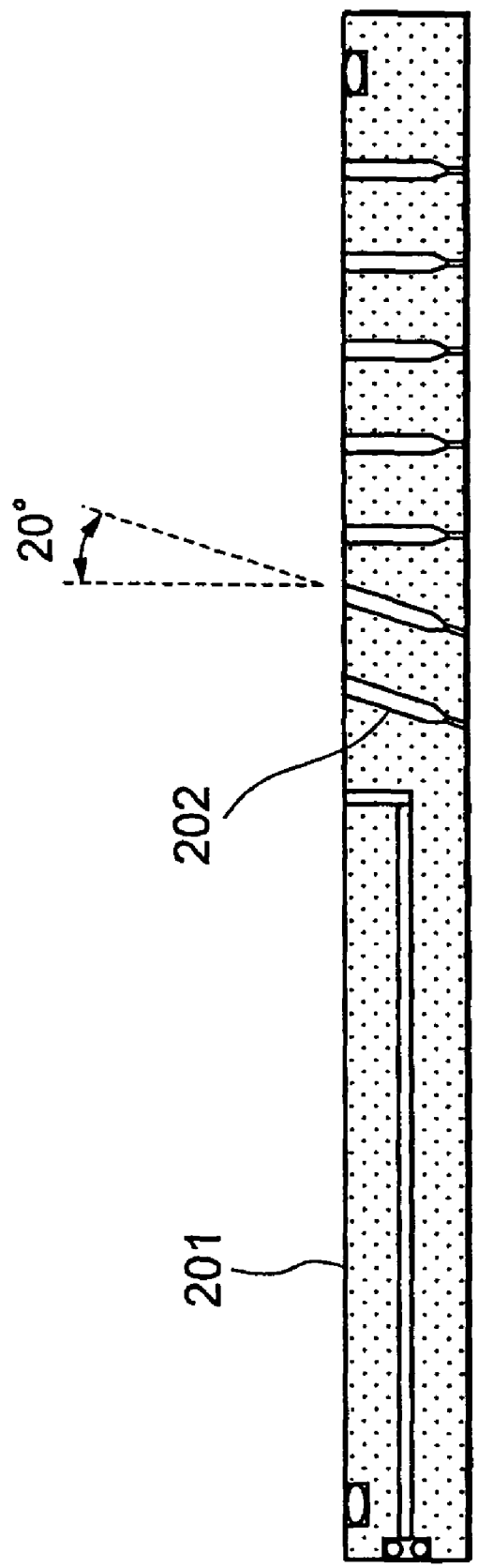
FIG. 13 is a sectional view of a shower plate for use in a fifth embodiment of this invention.

FIG. 13 shows a shower plate 201 according to the fifth embodiment of this invention. The shower plate 201 is applied to a microwave plasma processing apparatus for RIE. In the shower plate 201 for use in such a microwave plasma processing apparatus for RIE, gas ejection holes are arranged like in FIG. 12. However, in 16 gas ejection holes 202 arranged within a diameter of 60 mm of the shower plate, the axis of each gas ejection hole 202 has an angle of 20° with respect to the normal vector of an upper surface or a lower surface of the shower plate 201 so as to be directed toward the center of a processing substrate 103. The angle of inclination of the axis in the center direction is not limited to 20° and, further, this angle may be given the radial direction dependency.

Upon review of the gas flow in the shower plate of this structure, it has been found that the singular point at the center of the processing substrate disappears so that the uniform gas flow is realized over the entire processing substrate.

SIXTH EMBODIMENT

Figure 14:
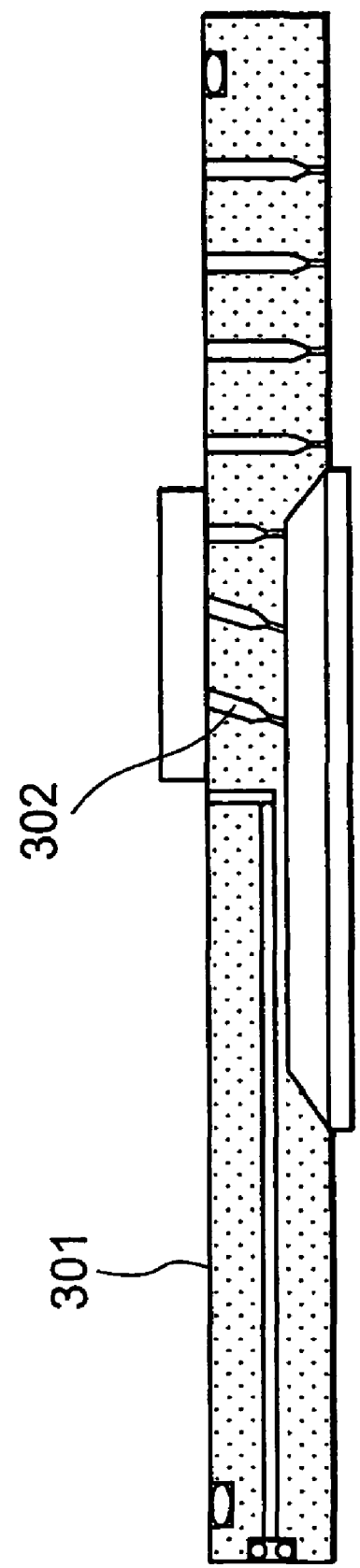
FIG. 14 is a sectional view of a shower plate for use in a sixth embodiment of this invention.

FIG. 14 shows a shower plate according to the sixth embodiment of this invention. This shower plate is applied to a microwave plasma processing apparatus for RIE. In this case, it differs from the plasma processing apparatus according to the first embodiment in that $C_5F_8$, $O_2$, and Ar are ejected as a process gas into a space through nozzles of a conductor construction 28.

In a shower plate 301 for use in such a microwave plasma processing apparatus for RIE, gas ejection holes are arranged like in FIG. 12. However, in 16 gas ejection holes 302 arranged within a diameter of 60 mm of the shower plate, the axis of each gas ejection hole 302 has an angle of 20° with respect to the normal vector of an upper surface or a lower surface of the shower plate 301 so as to be directed toward the center of a processing substrate 103.

As a result of using the RIE microwave plasma processing apparatus of this structure, the singular point of the gas flow at the center of the processing substrate disappears so that the uniform gas flow is realized and, further, the plasma flux reaching the processing substrate also becomes uniform, thereby enabling the highly uniform etching process at a high etching rate.

SEVENTH EMBODIMENT

Figure 15:
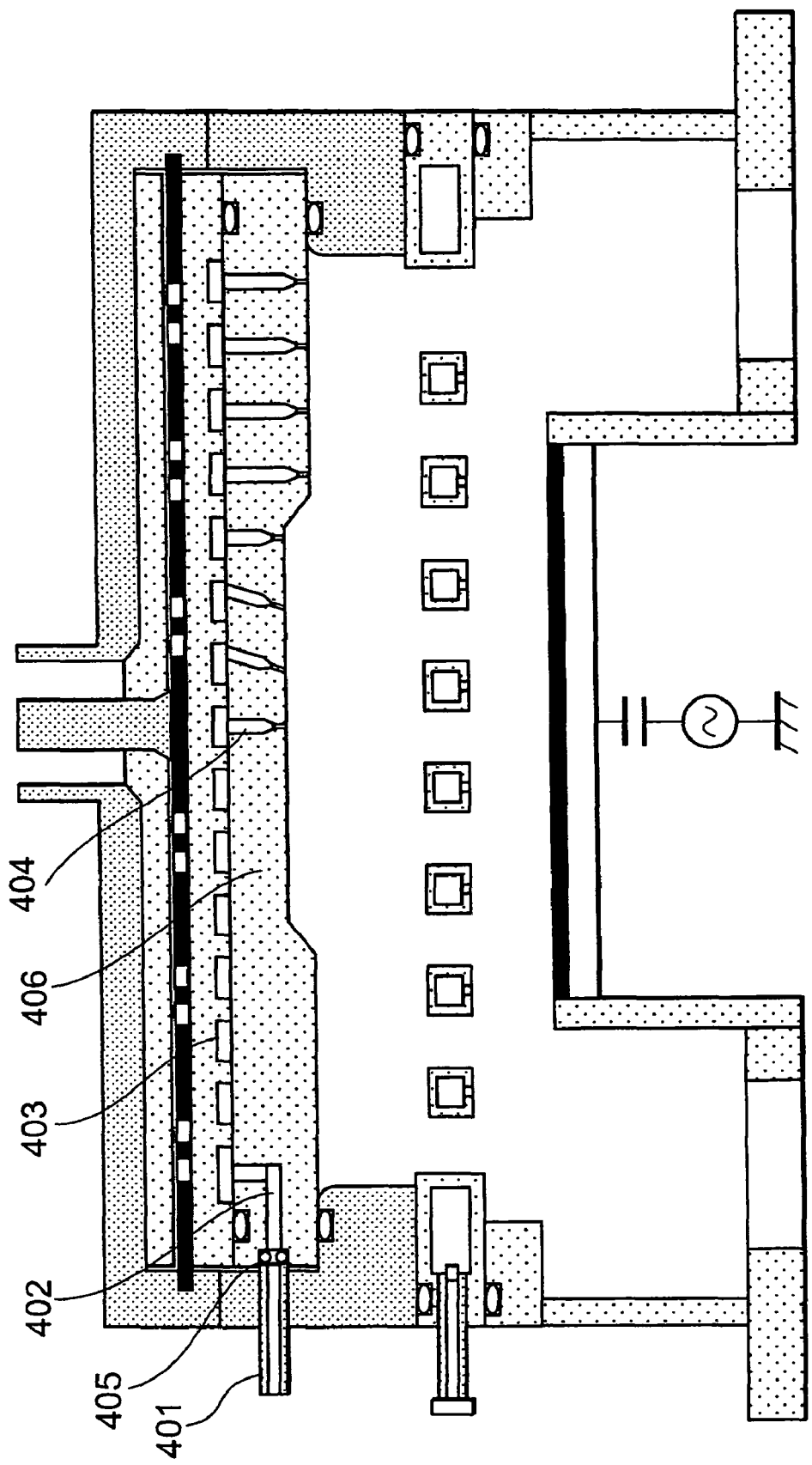
FIG. 15 is a diagram showing a schematic structure of a microwave plasma processing apparatus according to a seventh embodiment of this invention.

Referring to FIG. 15, there is shown a microwave plasma processing apparatus for RIE (Reactive Ion Etching) process. With respect to those that are the same in content as the first to sixth embodiments, explanation is omitted. Referring to FIG. 15, a plasma excitation gas supply port 401 is connected to a shower plate 406 through a seal ring 405. From the exterior of the system and through the plasma excitation gas supply port 401, a plasma excitation gas is introduced into a plasma gas space formed between the shower plate 406 and a cover plate through a plasma excitation gas supply passage 402 provided so as to communicate with a peripheral portion of the plasma gas space. In order to carry out uniform gas supply, it is desirable to provide a plurality of plasma excitation gas supply ports 401 and a plurality of plasma excitation gas supply passages 402 corresponding thereto. In the shower plate 406 for use in such a microwave plasma processing apparatus for RIE, gas ejection holes are arranged like in FIG. 14. In this embodiment, another gas ejection hole 404 is vertically formed further at the center of the shower plate 406. As a result of using the RIE microwave plasma processing apparatus of this structure, the singular point of the gas flow at the center of the processing substrate disappears so that the uniform gas flow is realized and, further, the plasma flux reaching the processing substrate also becomes uniform, thereby enabling the highly uniform etching process at a high etching rate.

As described above, according to this invention, there is an advantage in that the shower plate is applied to the plasma apparatus adapted to carry out the plasma processing such as film formation and etching so that the process gas can be uniformly supplied over the entire surface of the processing substrate, thereby preventing uneven contact and dissociation of the process gas to uniformly process the entire substrate.

The invention claimed is:

1. A shower plate having a plurality of ejection holes adapted to eject a gas, wherein:
   each ejection hole has a portion, on the side where the gas flows into the hole, having a width which is more than 0.5 mm and is not more than 5 mm and a portion, on the side where the gas flows out of the hole, having a width which is not less than 0.02 mm and is not more than 0.5 mm,
   the number y of gas ejection holes per unit area is given by a quadratic curve of a distance x from a center of the shower plate, and
   the quadratic curve is $y=0.0173x^2+5.3574x+71.517$.

2. A shower plate according to claim 1, wherein said portion having the width which is not less than 0.02 mm and is not more than 0.5 mm has a length of 0.2 mm to 2 mm.

3. A shower plate according to claim 2, wherein said shower plate has a thickness of at least 20 mm.

* * * * *